US011675935B2

(12) United States Patent
Pai et al.

(10) Patent No.: US 11,675,935 B2
(45) Date of Patent: Jun. 13, 2023

(54) METHODS AND SYSTEMS FOR COMPUTER-BASED PREDICTION OF FIT AND FUNCTION OF GARMENTS ON SOFT BODIES

(71) Applicant: Vital Mechanics Research Inc., Vancouver (CA)

(72) Inventors: Dinesh Kochikar Pai, Vancouver (CA); Darcy A. Harrison, Sunnyvale, CA (US); Ye Fan, Vancouver (CA); Egor Larionov, Vancouver (CA)

(73) Assignee: Vital Mechanics Research Inc., Vancouver (CA)

( * ) Notice: Subject to any disclaimer, the term of this patent is extended or adjusted under 35 U.S.C. 154(b) by 0 days.

(21) Appl. No.: 17/115,788

(22) Filed: Dec. 8, 2020

(65) Prior Publication Data

US 2021/0166478 A1  Jun. 3, 2021

Related U.S. Application Data

(63) Continuation of application No. PCT/CA2019/000092, filed on Jun. 13, 2019.
(Continued)

(51) Int. Cl.
*G06F 30/10* (2020.01)
*G06T 3/00* (2006.01)
(Continued)

(52) U.S. Cl.
CPC ............ *G06F 30/10* (2020.01); *G06T 3/0031* (2013.01); *G06T 17/20* (2013.01); *G06T 19/20* (2013.01);
(Continued)

(58) Field of Classification Search
None
See application file for complete search history.

(56) References Cited

U.S. PATENT DOCUMENTS 9,990,764 B2   6/2018   Bell et al.
2004/0049309 A1   3/2004   Gardner et al.
(Continued)

OTHER PUBLICATIONS

Macêdo, J. P. Gois and L. Velho, "Hermite Interpolation of Implicit Surfaces with Radial Basis Functions," 2009 XXII Brazilian Symposium on Computer Graphics and Image Processing, 2009, pp. 1-8, doi: 10.1109/SIBGRAPI.2009.11 (Year: 2009).*
(Continued)

*Primary Examiner* — William A Beutel
(74) *Attorney, Agent, or Firm* — Todd A. Rattray; Oyen Wiggs Green & Mutala LLP

(57) ABSTRACT

A method generates a three dimensional representation of a garment and comprises: obtaining a three dimensional human body model comprising an outer surface representative of an outermost surface of a human body; obtaining a three dimensional representation of a garment; and simulating a three dimensional physical interaction of the three dimensional body model with a three dimensional representation of the garment. Simulating the three-dimensional physical interaction comprises: deforming both the three-dimensional body model and the three dimensional representation of the garment; and displaying the deformed three-dimensional human body model and the deformed three-dimensional representation of the garment.

20 Claims, 8 Drawing Sheets

Related U.S. Application Data

(60) Provisional application No. 62/684,701, filed on Jun. 13, 2018.

(51) Int. Cl.
*G06T 17/20* (2006.01)
*G06T 19/20* (2011.01)

(52) U.S. Cl.
CPC ............ *G05B 2219/23006* (2013.01); *G05B 2219/35023* (2013.01); *G05B 2219/49008* (2013.01); *G06T 2210/16* (2013.01); *G06T 2219/2021* (2013.01)

(56) References Cited

U.S. PATENT DOCUMENTS

| | | | | |
|---|---|---|---|---|
| 2005/0267614 A1* | 12/2005 | Looney | ............... | G06F 30/00 700/98 |
| 2005/0267615 A1* | 12/2005 | Lavash | ............... | G06T 7/00 700/98 |
| 2014/0063003 A1 | 3/2014 | Kaula et al. | | |
| 2014/0114620 A1* | 4/2014 | Grinspun | ............... | A41H 3/007 703/1 |
| 2016/0309822 A1 | 10/2016 | Ng et al. | | |
| 2017/0024928 A1 | 1/2017 | Süßmuth et al. | | |
| 2017/0161948 A1* | 6/2017 | Hua | ............... | A41H 1/02 |
| 2018/0014583 A1* | 1/2018 | Peshek | ............... | A41B 1/08 |
| 2018/0020752 A1 | 1/2018 | Peshek et al. | | |
| 2018/0197331 A1 | 7/2018 | Chen et al. | | |

OTHER PUBLICATIONS

Li et al., "Fitting 3D garment models onto individual human models", Computers & Graphics 34 (2010) 742-755.

Baraff et al., "Large Steps in Cloth Simulation", Robotics Institute Carnegie Mellon University, pp. 1-12, 1998.

Cordier et al., "Integrating deformations between bodies and clothes", The Journal of Visualization and Computer Animation, J. Visual. Comput. Animat. 2001; 12: 45-53.

Harrison et al., "Fitting Close-to-Body Garments with 3D Soft Body Avatars", Proceedings of 3DBODY.TECH 2018 9th Int. Conference and Exhibition on 3D Body Scanning and Processing Technologies, Lugano, Switzerland, Oct. 16-17, 2018.

\* cited by examiner

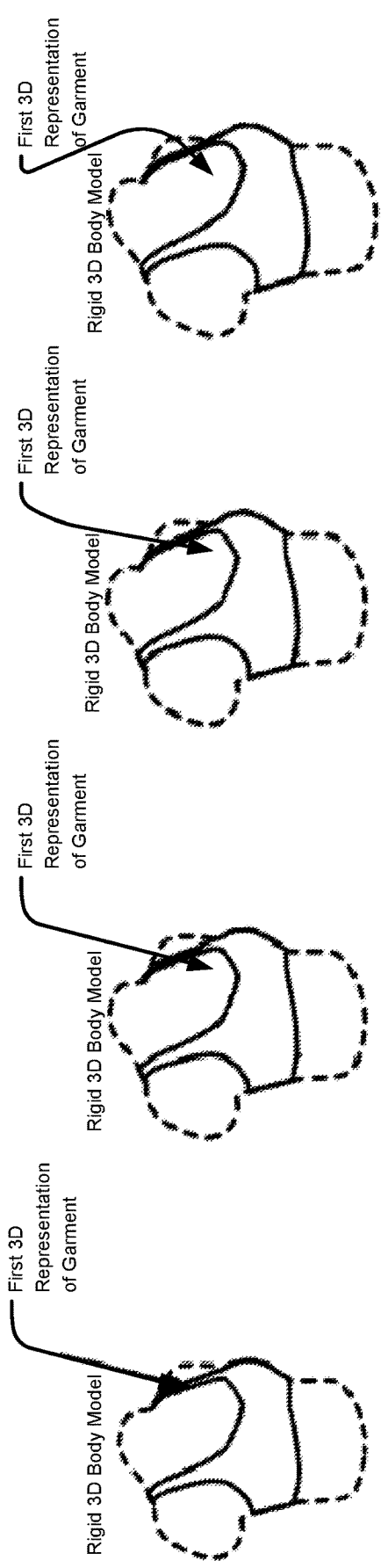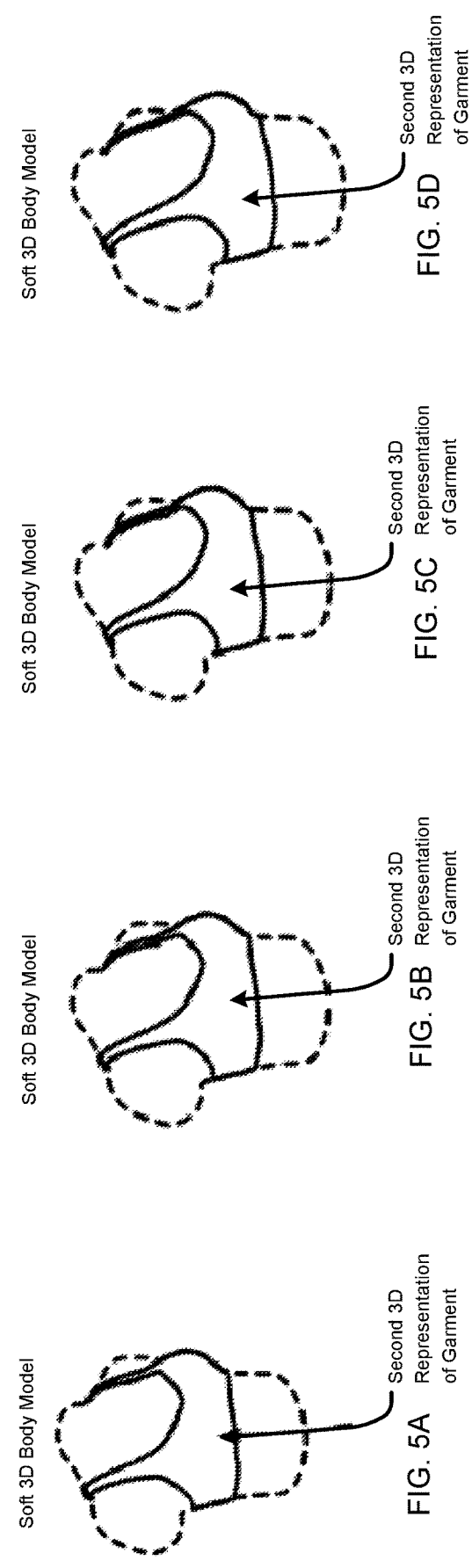
FIG. 5A  
FIG. 5B  
FIG. 5C  
FIG. 5D

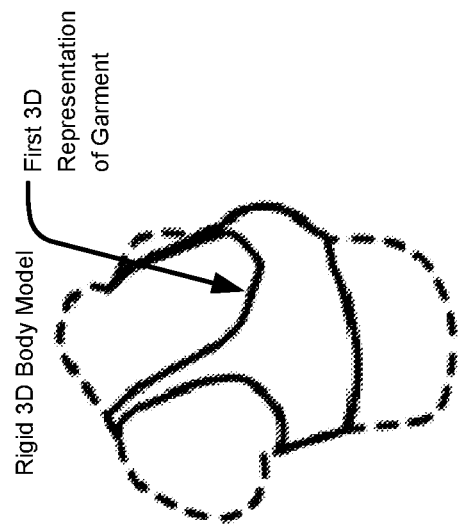
FIG. 5E
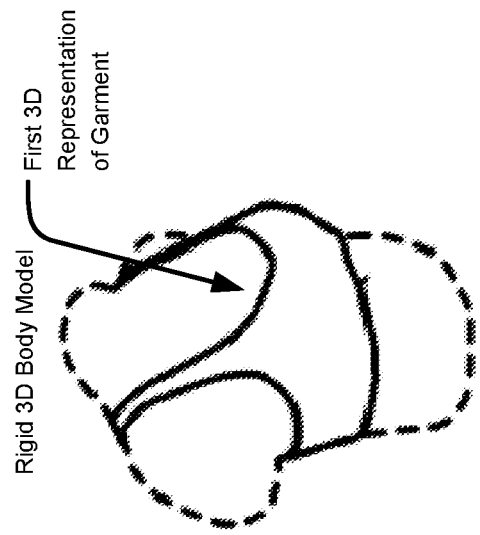
FIG. 5F
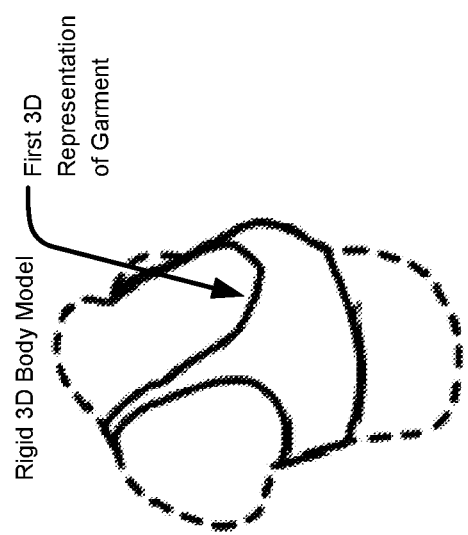
FIG. 5G
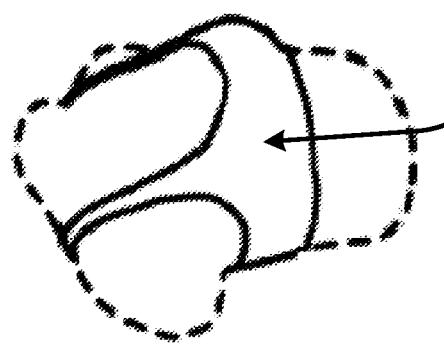
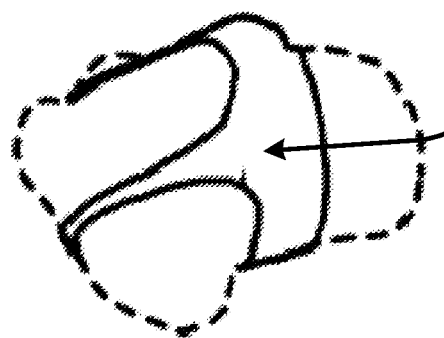
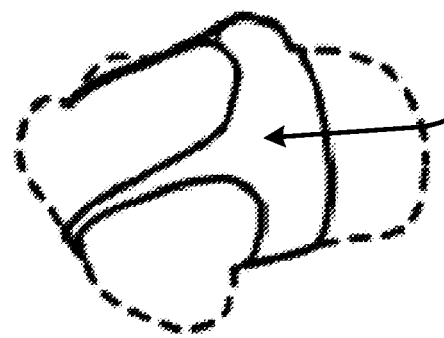

METHODS AND SYSTEMS FOR COMPUTER-BASED PREDICTION OF FIT AND FUNCTION OF GARMENTS ON SOFT BODIES

RELATED APPLICATIONS

This application is a continuation of Patent Cooperation Treaty (PCT) application No. PCT/CA2019/000092 having an international filing date of 13 Jun. 2019, which in turn claims priority from U.S. application No. 62/684,701 filed 13 Jun. 2018 and which in turn claims the benefit under 35 USC § 119(e) of U.S. application No. 62/684,701 filed 13 Jun. 2018. PCT application No. PCT/CA2019/000092 and U.S. application No. 62/684,701 are hereby incorporated herein by reference.

TECHNICAL FIELD

The technology disclosed herein relates to the computer-based sales, selection, distribution, manufacture and/or design of apparel worn close to the human body. Non-limiting examples of such apparel includes, without limitation, intimate apparel such as bras and panties, athletic apparel such as sports bras and yoga pants, swimwear, footwear, prosthetic supports, compression stockings and other medical clothing, neoprene diving suits, and everyday apparel such as dresses, skirts, suits, pants, blouses, shirts, sweatshirts and T-shirts.

BACKGROUND

There is a desire to accurately predict the fit of apparel on the human body. This is a challenging task, particularly for, but not limited to, apparel worn close to body. One reason for such challenge is that the human body is soft and may deform when the garment is worn, changing the shape of both the body and the garment. Another reason is that the fit depends on how the garment is worn and where on the body the garment is placed. It is widely recognized that poor fit is a major problem facing the apparel industry.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One aspect of the invention provides a method for generating three-dimensional representations of a garment. The method comprises: obtaining a three-dimensional human body model comprising an outer surface, the outer surface representative of an outermost surface of a human body; obtaining a plurality of two-dimensional garment pattern elements, each garment pattern element representative of a portion of a garment; generating a two-dimensional map of the three-dimensional human body model and displaying the two-dimensional map on a display; permitting user arrangement of a first set of garment pattern elements from among the plurality of two-dimensional garment pattern elements on the displayed two-dimensional map to thereby display an arrangement of the first set of garment pattern elements on the two-dimensional map; and generating and displaying a first three-dimensional representation of the garment worn on the three-dimensional human body model. The first three-dimensional representation of the garment is based at least in part on the arrangement of the first set of garment pattern elements on the two-dimensional map.

The method may further comprise: permitting user re-arrangement of one or more of the first set of garment pattern elements on the displayed two-dimensional map to thereby display a second arrangement of a second set of garment pattern elements on the two-dimensional map; and generating and displaying a second three-dimensional representation of a second garment. The second three-dimensional representation of the second garment may be based at least in part on the second arrangement of the second set of garment pattern elements on the two-dimensional map.

Another aspect of the invention provides a method for generating a three dimensional representation of a garment. Such methods comprise: obtaining a three dimensional human body model comprising an outer surface, the outer surface representative of an outermost surface of a human body; obtaining a three dimensional representation of a garment; and simulating a three dimensional physical interaction of the three dimensional body model with a three dimensional representation of the garment. Simulating the three-dimensional physical interaction may comprise: deforming both the three-dimensional human body model and the three dimensional representation of the garment; and displaying the deformed three-dimensional human body model and the deformed three-dimensional representation of the garment. In the context of this disclosure and the accompanying claims, the word deformation and its related terms should be understood to include rigid motion (translation and rotation).

Generating and displaying the second three-dimensional representation of the garment may comprise manipulating the first three-dimensional representation of the garment.

The second three-dimensional representation of the garment may be generated and displayed in real-time as the user re-arranges garment pattern elements on the displayed two-dimensional map.

Permitting user arrangement and re-arrangement of garment pattern elements may comprise permitting translational and/or rotational movement of one or more of the plurality of garment pattern elements relative to the displayed two-dimensional map and/or scaling of one or more of the plurality of garment pattern elements.

Permitting translational and/or rotational movement of one or more of the plurality of garment pattern elements relative to the displayed two-dimensional map may comprise permitting user-selection and dragging of the one or more of the plurality of garment pattern elements relative to the displayed two-dimensional map using one or more input/output suitable devices (e.g. computer keyboard, computer mouse, computer touch-screen interface and/or the like).

Permitting user-selection and dragging of the one or more of the plurality of garment pattern elements relative to the displayed two-dimensional map may comprise permitting the user to drag one or more of the plurality of garment pattern elements from a first region of the displayed two-dimensional map to a second region of the displayed two-dimensional map, the first and second regions corresponding to first and second regions of the outer surface of the three-dimensional human body having normal vectors that are at least approximately anti-parallel (e.g. having orientations in a range of 160°-180° of one another in some embodiments or in a range of 170°-180° in some embodiments).

Permitting user re-arrangement of one or more of the first set of garment pattern elements on the displayed two-dimensional map to thereby display the second arrangement of the second set of garment pattern elements on the two-dimensional map may comprise removing at least one of the first set of garment pattern elements from the displayed two-dimensional map such that the second set of garment pattern elements is different than the first set of garment pattern elements.

Permitting user re-arrangement of one or more of the first set of garment pattern elements on the displayed two-dimensional map to thereby display the second arrangement of the second set of garment pattern elements on the two-dimensional map may comprise adding at least one garment pattern element to the displayed two-dimensional map such that the second set of garment pattern elements is different than the first set of garment pattern elements.

The second set of garment pattern elements may be the same as the first set of garment pattern elements.

The method may comprise: permitting user selection of a pair of connection curves, the pair connection curves located on corresponding edges of the first set of garment pattern elements. Generating and displaying the first three-dimensional representation of the garment worn on the three-dimensional human body model may comprise joining the corresponding edges of the first set of garment pattern elements in the first three-dimensional representation of the garment.

Joining the corresponding edges of the first set of garment pattern elements may comprise making the pair of connection curves coincident in the first three-dimensional representation of the garment.

Generating the two-dimensional map may comprise: decomposing the outer surface of the human body model into an atlas comprising a plurality of two-dimensional charts; and tiling the plurality of two-dimensional charts together to form a first continuous two-dimensional representation of the outer surface of the human body model.

Generating the two-dimensional map may comprise: generating a second continuous two-dimensional representation of the outer surface of the human body model, the second two-dimensional representation of the outer surface of the human body model a 180° rotated replica of the first two-dimensional representation of the outer surface of the human body model; and tiling the first and second continuous two-dimensional representations of the outer surface of the human body model to generate the two-dimensional map.

A point on the two-dimensional map may uniquely correspond to a point on the outer surface of the human body model.

The method may comprise displaying anatomical landmarks on the displayed two-dimensional map to guide user arrangement of the first set of garment pattern elements on the displayed two-dimensional map.

The method may comprise displaying anatomical tailoring guidelines on the displayed two-dimensional map to guide user arrangement of the first set of garment pattern elements on the displayed two dimensional map.

The method may be embedded in a web application, the web application permitting a web user (the user of any other claim herein) to visualize the appearance of a garment on an avatar of the web user, the avatar comprising the three-dimensional human body model and representative of the body of the web user.

20. A method according to claim 19 or any other claim herein wherein the three dimensional human body model comprises a three-dimensional body mesh and the three dimensional representation of the garment comprises a two-dimensional garment mesh in a three-dimensional space.

The three dimensional human body model may comprise a three-dimensional body mesh and the three dimensional representation of the garment comprises a three-dimensional garment mesh.

Deforming both the three-dimensional human body model and the three-dimensional representation of the garment may comprise optimizing (e.g. extremizing) an energy function that represents a variational formulation of the physical properties of deformation of the body and the garment, which attributes cost to deformation of the body and garment away from a reference (e.g. non-deformed) state.

Simulating the three dimensional physical interaction of the three dimensional body model with the three dimensional representation of the garment may comprise: obtaining a movement of the body model which models movement of the three-dimensional human body model over a series of time steps; and for each of the time steps, optimizing (e.g. extremizing) an energy function that represents a variational formulation of the physical properties of deformation of the body and the garment, which attributes cost to deformation of the body and garment away from a reference (e.g. non-deformed) state.

Optimizing (e.g. extremizing) the energy function may be subject to one or more non-penetration constraints that prevent the three dimensional representation of the garment from penetrating the three-dimensional human body model.

The one or more non-penetration constraints that prevent the three dimensional representation of the garment from penetrating the three-dimensional human body model may comprise: an intermediate implicit surface parameterized by $X\_s$ which is constrained by the outer surface of the three-dimensional human body model; and one or more intermediate constraints that prevent the three dimensional representation of the garment from penetrating the implicit surface.

The one or more intermediate constraints may be constructed by a combination of basis functions. The basis functions may comprise Hermite radial basis functions.

Optimizing (e.g. extremizing) the energy function subject to one or more non-penetration constraints may comprise solving or approximating a solution of a system having a formulation shown in system of equations (2) described above.

The method may comprise constraining the 3D body mesh to avoid penetration of an inner body surface, the inner body surface comprising an implicit surface parameterized by $X_r$.

Constraining the 3D body mesh to avoid penetration of an inner body surface may comprise allowing vertices on an interior of the 3d body mesh to slide relative to the inner body surface subject to a coupling energy that penalizes displacements.

Constraining the 3D body mesh to avoid penetration of the inner body surface may comprise solving or approximating a solution of a system having a formulation shown in system of equations (3) described above.

The energy function may comprise a pseudo-potential representing frictional energy dissipation due to deformation.

The method may comprise alternatively (staggering): solving or approximating the optimization problems defined by any one of equations systems (1)-(4) described above; and solving or approximating the optimization problem defined by equation (11) described above.

Optimizing may comprise approximating the optimization using an interior point method. Optimizing may comprise solving or approximating the optimization problem defined by equation system (4) described above.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIGS. 5A to 5G (collectively FIG. 5) illustrate example three dimensional representations of a garment modelled on soft body model where the body moves over a series of time steps according to a particular embodiment of the invention.

DESCRIPTION

Figure 1:
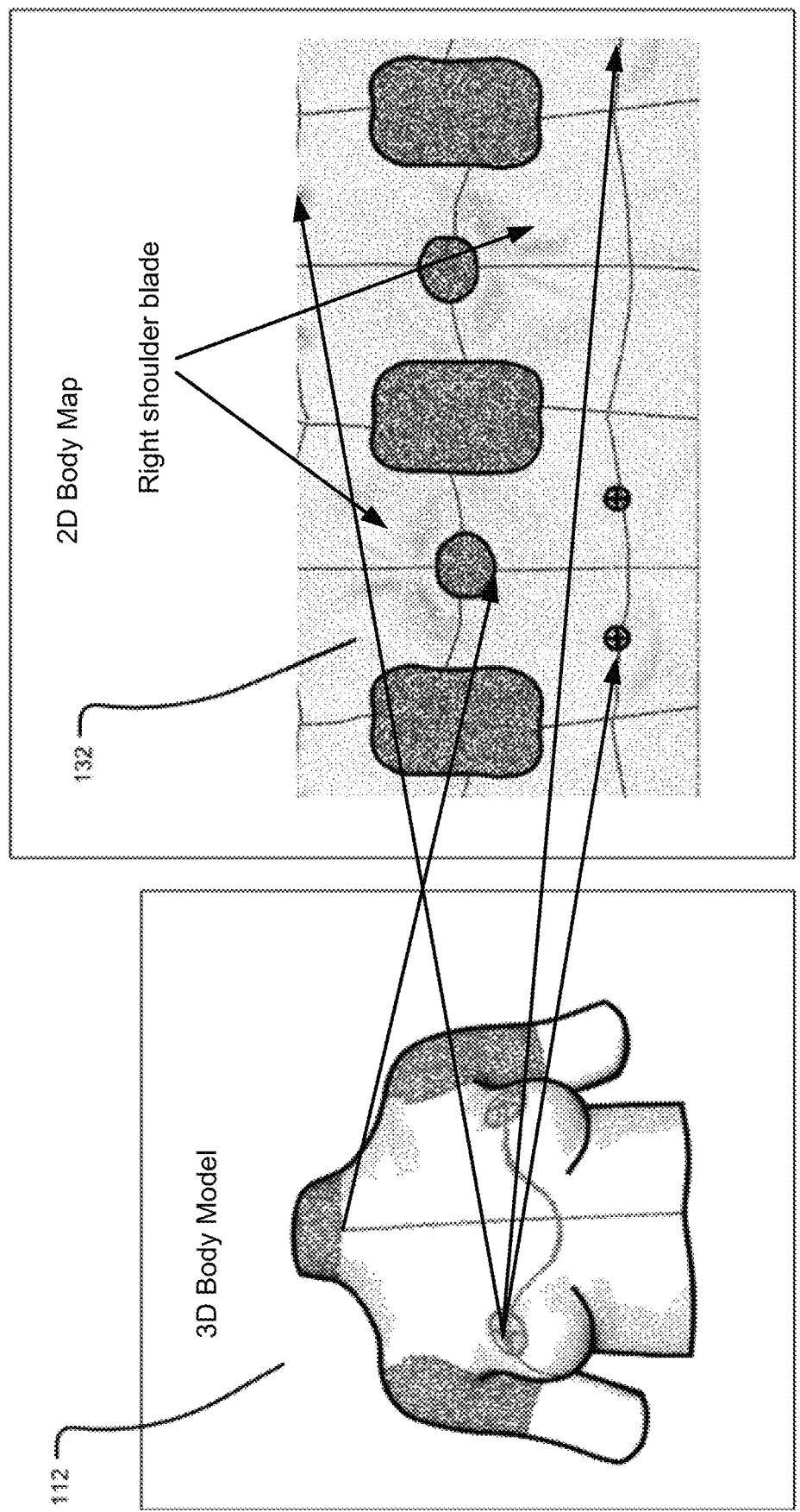
FIG. 1 illustrates an example two-dimensional map generated from a three-dimensional human body model according to aspects of the methods described herein.

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

One aspect of the invention provides a method for generating three-dimensional representations of a garment. The method comprises: obtaining a three-dimensional human body model comprising an outer surface, the outer surface representative of an outermost surface of a human body; obtaining a plurality of two-dimensional garment pattern elements, each garment pattern element representative of a portion of a garment; generating a two-dimensional map of the three-dimensional human body model and displaying the two-dimensional map on a display; permitting user arrangement of a first set of garment pattern elements from among the plurality of two-dimensional garment pattern elements on the displayed two-dimensional map to thereby display an arrangement of the first set of garment pattern elements on the two-dimensional map; and generating and displaying a first three-dimensional representation of the garment worn on the three-dimensional human body model. The first three-dimensional representation of the garment is based at least in part on the arrangement of the first set of garment pattern elements on the two-dimensional map.

The method may further comprise: permitting user rearrangement of one or more of the first set of garment pattern elements on the displayed two-dimensional map to thereby display a second arrangement of a second set of garment pattern elements on the two-dimensional map; and generating and displaying a second three-dimensional representation of a second garment. The second three-dimensional representation of the second garment may be based at least in part on the second arrangement of the second set of garment pattern elements on the two-dimensional map.

3D Garment Models Using 2D Garment Pattern Elements and 2D Body Map

Methods according to particular embodiments and/or aspects of this invention make use of three-dimensional (3D) human body models. A 3D human body model comprises a computer representation of the 3D shape of a corresponding human body, or a portion of the human body. Such 3D human body models could comprise: mesh-based representations (e.g. with vertices, edges, and faces); parametric representations, and/or implicit representations.

Methods according to particular embodiments and/or aspects of this invention make use of garment pattern elements. A garment pattern element comprises a computer representation of a portion of a garment. Together a set of garment pattern elements provide an entire garment. A garment pattern element may comprise a computer representation of an element of a pattern, wherein the elements of the pattern may be joined to one another by stitching, bonding and/or other suitable joining techniques A garment pattern element may comprise a computer representation of piece of a garment that has been cut and digitized; in this case there is no seam or stitch between garment pattern elements, but the garment pattern elements still represent parts of a whole garment. Garment pattern elements may be flat—e.g. two-dimensional computer representations. Garment pattern elements may comprise two-dimensional representations of three-dimensional curved components (e.g. a bra cup).

A significant challenge for placing a virtual garment (e.g. a computer representation of a garment) on a virtual human (e.g. a 3D human body model) is that garment pattern elements are almost always flat 2D objects.

This is because most garments are made by cutting fabrics which are inherently flat and sewing them together. By contrast, human body models, like the human body itself, are inherently curved and three dimensional.

Even though some garment pattern elements, such as bra cups, may be curved in three dimensions, it is intuitive and useful for apparel designers to represent them as flat 2D projections with elevation maps.

Any pair of garment pattern elements may be joined together by indicating connection curves where the garment pattern elements should be joined. Such connection curves may be located on corresponding portions of corresponding edges of garment pattern elements, although location of such connection curves on the edges of garment pattern elements is not necessary. In some embodiments, after two such connection curves are joined, the two curves will be coincident. Stitching, bonding, and other techniques for connection two (or more) garment pattern elements may be represented in this manner.

Existing garment simulation software attempts to place garment pattern elements in the vicinity of a human body model by positioning and rotating each garment pattern element in 3D, manipulating six degrees of freedom (three for positioning and three for rotation) using a computer interface and corresponding input/output devices. Manipulating six degrees of freedom is challenging with most computer interfaces and input/output devices, such as mice and touch screens.

Instead, aspects of the invention disclosed herein comprise constructing or otherwise generating and displaying an unfolded 2D representation (a 2D body map) of the curved 3D human body model.

A user may arrange garment pattern elements on the displayed 2D body map by translating (positioning), scaling and/or rotating the 2D shapes of the garment pattern elements in 2D, which requires, in addition to the potential for scaling, only three degrees of freedom (two for translation and one for rotation). In addition to reducing the number of movement-related degrees of freedom by a half, moving 2D shapes is well matched to widely available computer interfaces.

The displayed 2D body map may show anatomical landmarks on the body such as nipples, shoulder blades, and neck to guide the arrangement of garment pattern elements.

The displayed 2D body map may display guidelines commonly used in tailoring such as bust point, neckline, shoulder line, armholes, center front, center back, and side seams (See FIG. 1).

Two-dimensional body maps may be generated using any of a variety of methods. In particular embodiments, the 3D human body model is decomposed into an atlas comprising a plurality of 2D charts. The charts may be then tiled together to form a continuous 2D representation of the 3D human body model—i.e. a 2D body map (see FIG. 1).

Note that the tiling may be repeated. In the 2D body map shown in FIG. 1, a 3D human body model of the torso may be represented by one chart with the front of the body at the bottom left of the 2D body map and the back of the body at the top left. This chart is then replicated and attached to the first chart after a rotation of 180° to provide another copy of the chart on each side of the first chart to provide a seamless 2D map of the body.

In FIG. 1, observe that the right nipple on the 3D body model is represented in more than one location on the 2D body map. Similarly from the nipple you can reach the shoulder blades of the back by a continuous path going over the shoulder (moving vertically on the 2D body map) or around the sides (moving horizontally on the 2D body map).

Because of this continuous tiling, a garment pattern element can be continuously dragged over the surface of the body, without having to change views of the body, and remain on the surface of the body throughout. This feature of various embodiments and aspects of the invention significantly simplifies placement of garment pattern elements on the human body model.

Figure 2:
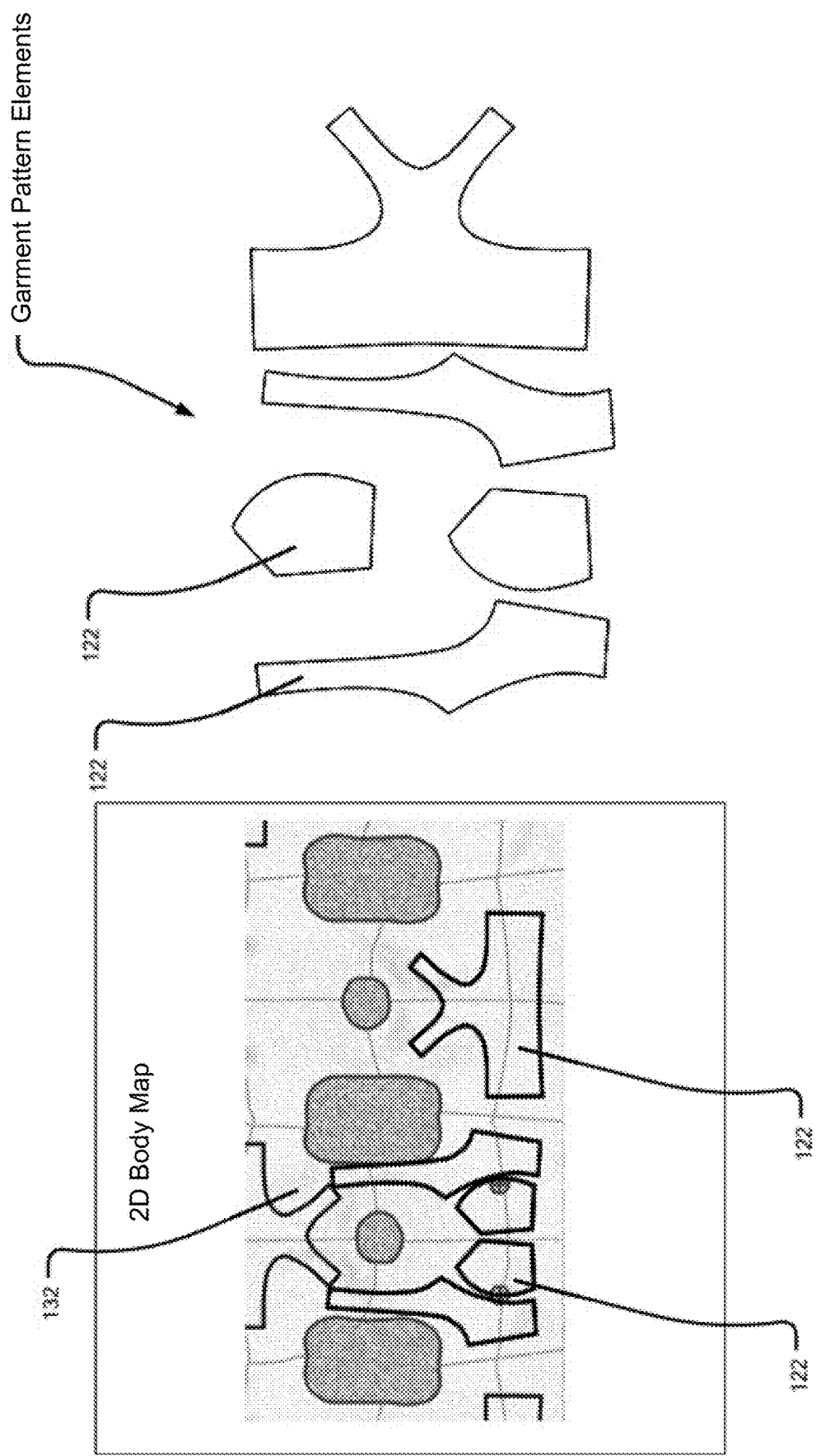
FIG. 2 illustrates an example interface for arranging a plurality of garment pattern elements on the two-dimensional map of FIG. 1.

FIG. 2 shows several garment pattern elements on the right panel that have been arranged on the 2D body map in the left panel. The user may select a garment pattern element (shown with bounding box in the figure) and move it to any position and orientation on the 2D body map by dragging and rotating it in 2D. This is a quick and natural manipulation. Since the entire surface of the human body model is visible in the 2D body map this manipulation requires no change of view to perform this manipulation.

Figure 3:
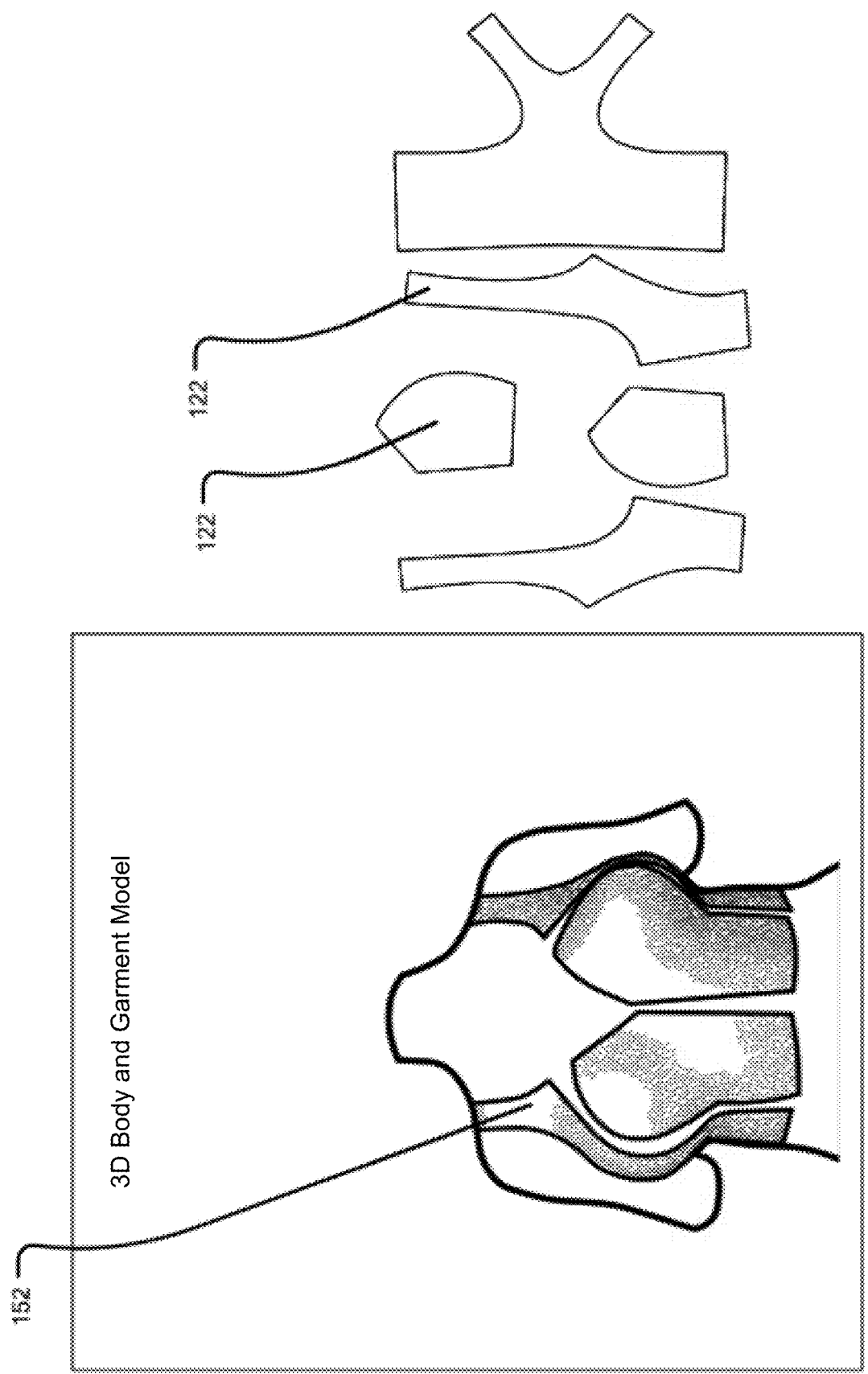
FIG. 3 illustrates an example three dimensional representation of a garment comprising the plurality of garment pattern elements of FIG. 2.

The 2D body map establishes a unique correspondence between a point on the 2D body map and a point on the human body model, even though a point on the human body model may correspond to a many points on the 2D body map. Thus, for any placement of a garment pattern element on the 2D body map, there is a unique "lifting" of the garment pattern element onto the 3D surface of the human body model. FIG. 3 shows an example of how the unique correspondence is used to lift the garment pattern elements from the 2D body map on to the 3D human body model. The garment pattern elements are shown prior to stitching/connecting them to clearly illustrate how individual garment pattern elements are lifted onto the 3D human body model.

Figure 4:
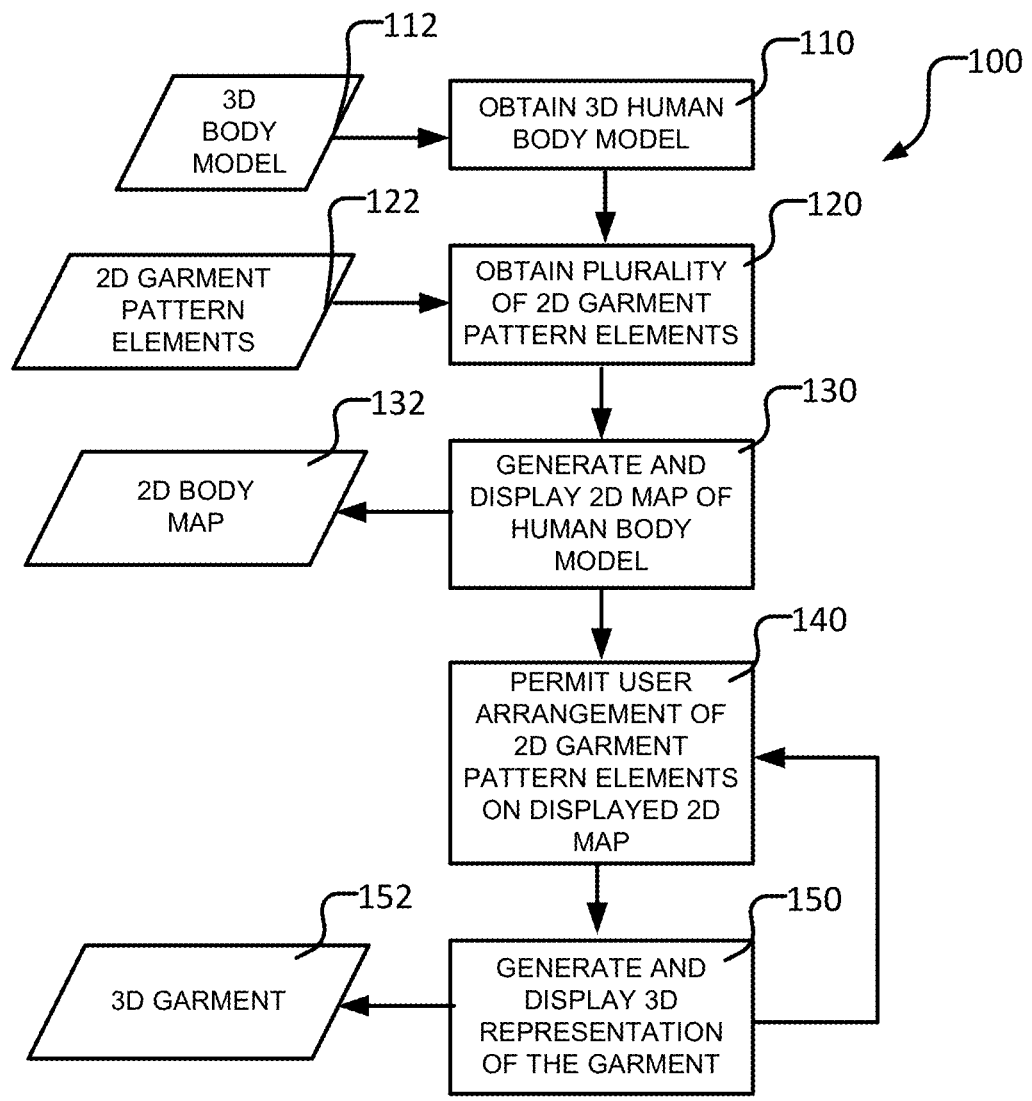
FIG. 4 is a flow chart of an example method described herein.

FIG. 4 illustrates a method 100 for generating a three-dimensional representation of a garment on a body according to a particular embodiment of the invention. The body on which the garment may be modelled using method 100 may comprise a 3D human body model of any of the types described herein or any other suitable type of 3D human body model. Method 100 may be used, for example, to evaluate the fit or general appearance of a garment on a body, to evaluate the correct size of a garment, to evaluate the deformation of a garment caused by a body (or vice versa), to design garments and/or the like. Method 100 may be implemented on a computer running suitably configured software. In some particular embodiments, method 100 may be implemented as a software module or add-on (e.g. to existing graphics or simulation software). In some particular embodiments, method 100 may be implemented as (or embedded in) a web-based application to permit a web-user to visualize the appearance of a garment on an avatar of the web user, where the avatar comprises a three-dimensional human body model representative of the body of the web user. In some particular embodiments, method 10 may be implemented as a stand-alone software application.

Method 100 start is block 110 which comprises obtaining a 3D human body model 112. In general 3D human body model 112 may comprise any computer based 3D model of a corresponding human body (or portion of a body) capable of providing the functionality described herein. Three-dimensional human body model 112 may comprise, but is not limited to: a mesh-based 3D body representation (e.g. with vertices, edges, and faces); a parametric 3D body representation, an implicit 3D body representation and/or the like. Three-dimensional body model 112 may comprise an outer surface representative of an outermost surface of a human body. An exemplary 3D model 112 of a woman's torso is shown in FIG. 1. Three-dimensional body model 112 may be obtained in block 110 in any suitable manner. In some embodiments, 3D human body model 112 may be obtained in block 110 by: generating model 112 from scratch, input from a user (e.g. from some other computer, storage device or software application), input from memory accessible to the computer performing method 100, 3D body scanners, time of flight cameras, mobile (e.g. smartphone) devices, other computer vision systems and/or the like.

Method 120 then proceeds to block 120 which comprises obtaining a plurality of 2D garment elements 122. Garment elements 122 may comprise computer representations (e.g. models) of 2D shapes which may correspond to portions of a garment. Together a set of garment pattern elements 122 may provide an entire garment. A garment pattern element 122 may comprise a computer representation of an element of a sewing (or other garment fabrication) pattern, wherein the elements of the garment fabrication pattern may be joined to one another by stitching, bonding and/or other suitable joining techniques A garment pattern element 122 may additionally or alternative comprise a computer representation of portion of a garment that has been cut from an actual garment and digitized. Garment pattern elements 122 may be flat (2D computer representations). Garment pattern elements 122 may comprise two-dimensional representations of curved components (e.g. a bra cup). Garment pattern elements 122 may be obtained in block 120 in any suitable manner. In some embodiments, garment pattern elements 122 may be obtained in block 120 by: generating garment pattern elements 122 from scratch (e.g. by user input of the shapes), input from some other computer, storage device or software application, input from memory accessible to the computer performing method 100 and/or the like.

Garment pattern elements 122 obtained in block 120 may be displayed to a user via a suitable user interface (e.g. on a display that is accessible to the computer performing method 100). FIG. 2 shows a number of garment pattern elements 122 that are presented on a display (on the right half of the diagram) and also illustrates how these garment pattern elements 122 may be dragged onto a 2D body map 132 (on the left hand side of the diagram).

Method 100 then proceeds to block 130, which involves generating a 2D body map 132 corresponding to the block 110 3D human body model 112 and displaying 2D body map 132 on a display accessible to the computer implementing method 100. Two-dimensional body map 132 may be generated using any of a variety of 3D to 2D conversion techniques (e.g. projections, decompositions and/or the like). In particular embodiments, the 3D human body model 112 is decomposed into an atlas comprising a plurality of 2D charts (not expressly shown). The charts may be then tiled together to form a continuous 2D representation (body map 132) of the 3D human body model 112.

FIG. 1 shows a 2D body map 132 that corresponds to the FIG. 1 body model 112 and that is displayed to a user through a suitable user interface. FIG. 2 also shows a 2D body map onto which a user has dragged a number of garment pattern elements 122. The displayed 2D body map 132 may show anatomical landmarks on the body such as nipples, shoulder blades, and neck to guide the arrangement of garment pattern elements. The displayed 2D body map 132 may display guidelines commonly used in tailoring such as bust point, neckline, shoulder line, armholes, center front, center back, and side seams.

In some embodiments, as shown in FIGS. 1 and 2 and explained elsewhere herein, 2D body map 132 may comprise several replications of one or more charts or portions of 3D body model 112. Body map 132 may comprise more than one location which corresponds to a particular location on 3D body model 110. However, in currently preferred embodiments, 2D body map 132 establishes a unique correspondence between a point on 2D body map 132 and a point on the human body model 110, even though a point on the human body model 110 may correspond to a many points on the 2D body map 132.

Method 100 then proceeds to block 140 which involves permitting the user to arrange 2D garment pattern elements 122 onto the displayed 2D body map 132. Typically, this would be done by a user via a user interface and a corresponding input/output device. For example, a user may select and drag a garment pattern element 122 from on portion of the user interface and drag the garment pattern element 122 onto the displayed 2D body map 132 using a mouse, a touch-screen, a track pad and/or similar input/output device. Once on the displayed 2D body map 132, the user may further move (e.g. translate or rotate) and/or scale the garment pattern element 122 on the displayed body map 132 using similar techniques. A set of garment pattern elements 122 may be arranged on the displayed body map 132 in an arrangement corresponding to a garment. This is shown on the left hand side of FIG. 2.

Arranging 2D garment pattern elements 122 on 2D body map 132 in block 140 may comprise forming connections between pairs of garment pattern elements 122. Any pair of garment pattern elements 122 may be joined together by indicating or selecting connection curves where the garment pattern elements 122 should be joined. Such connection curves may be located on corresponding portions of corresponding edges of garment pattern elements 122, although location of such connection curves on the edges of garment pattern elements 122 is not necessary. In some embodiments, after two such connection curves are joined, the two connection curves will be coincident. Forming such connections in block 140 may simulate stitching, bonding, and other techniques for connection two (or more) garment pattern elements 122.

Method 100 the proceeds to block 150 which comprises generating and displaying a first three-dimensional representation 152 of the garment worn on the three-dimensional human body model 110. The first three-dimensional representation of the garment 152 is based at least in part on the block 140 arrangement of the first set of garment pattern elements 122 on the two-dimensional map 132. For any block 140 arrangement of garment pattern element 122 on 2D body map 132, there is a unique "lifting" of the garment pattern elements 132 onto the 3D surface of human body model 110. FIG. 3 shows an example of how the unique correspondence is use to lift the garment pattern elements 122 from 2D body map 122 (as arranged in FIG. 2 left hand side) onto 3D human body model 110 to thereby provide 3D garment model 152 on body model 110. Garment pattern elements 122 in 3D garment model 152 illustrated in FIG. 3 are shown prior to forming connections between them to clearly illustrate how individual garment pattern elements 122 are lifted onto 3D human body model 122.

Method 100 may permit the user to re-arrange garment pattern elements 122 on body map 132 (including by substituting or otherwise changing particular garment pattern elements 122 on body map 132) and may update the 3D garment model 152 accordingly. This is represented as a loop of blocks 140 and 150 in method 100.

Soft Body Modelling

Aspects of the invention provide methods for generating a three dimensional representation of a garment. Such methods comprise: obtaining a three dimensional human body model comprising an outer surface, the outer surface representative of an outermost surface of a human body; obtaining a three dimensional representation of a garment; and simulating a three dimensional physical interaction of the three dimensional body model with a three dimensional representation of the garment. Simulating the three-dimensional physical interaction may comprise: deforming both the three-dimensional human body model and the three dimensional representation of the garment; and displaying the deformed three-dimensional human body model and the deformed three-dimensional representation of the garment. In the context of this disclosure and the accompanying claims, the word deformation and its related terms should be understood to include rigid motion (translation and rotation).

In some embodiments, the soft tissues of the 3D human body model 112 may be modeled as a layer of non-linear viscoelastic material that extends from the skin (that is, the outer surface of the body model 112) to a virtual interior surface that models more rigid internal body structures (not expressly illustrated in the drawings). This 3D soft tissue layer (between the outer surface of the body model 112 and the virtual interior surface) may be discretized into a 3D mesh, comprising vertices, edges, faces and cells. The 3D mesh layer may be of any kind of 3D mesh suitable for computer-based finite element analysis such as, without limitation, a tetrahedral mesh or a hexahedral mesh. The state of each body mesh vertex is denoted $x_b$. This state includes the coordinates of the position of the point associated with the vertex, and may include the velocity (and other time derivatives) of the point for simulating the dynamics. This state may also include other characteristics and/or metadata associated with the point in the body model 112.

The subset of body vertices that makeup the interior surface may be denoted by $x_{b,r}$. The subset of body vertices that makeup the exterior surface may be denoted by $x_{b,s}$.

The garment model 152 may similarly be discretized into a mesh comprising vertices, edges, and faces. The garment mesh may be a volumetric mesh, but this is not necessary. In currently preferred embodiments, the garment mesh is represented by a 2D mesh embedded in 3D. The state of the each garment (or cloth) mesh vertex may be denoted $x_c$. As with a body vertex, this state may include the coordinates of the position of the point associated with the vertex, and may include the velocity (and other time derivatives) of the point other characteristics and/or metadata associated with the point in the garment model 152.

One aspect of particular embodiments of the invention involves the use of implicit surface representations of the exterior surface and interior surfaces of the body model 112, with which the mesh vertices (body and cloth mesh vertices) make contact. These implicit surfaces may be defined as the zero-level set of a constraint function c. The interior implicit surfaces may be parameterized by a set of parameters denoted $X_r$ and may contact the body mesh vertices. Similarly the exterior surfaces may be parameterized by a set of parameters denoted $X_s$ and may contact the cloth mesh.

Cloth-Body Optimization

Modelling the fit of the garment model 152 on the 3D body model 112 may, in some embodiments, comprise optimizing the energy of both the cloth and the body discretizations (meshes) subject to contact constraints. Mathematically, this optimization problem can be written as $$\operatorname*{argmin}_{x_c, x_b} W_c(x_c) + W_b(x_b) \tag{1}$$

subject to $$c(x_c^j; x_b) \geq 0 \ \forall j$$

where $W_c$ is an energy-like objective function (or briefly, "energy") of the cloth and $W_b$ is a similar energy of the body. These energies may include the elastic potential energy, the Gibbs' function that encodes Gauss's principle of least constraint, the Hamiltonian, or the Lagrangian. The potential energy may include pseudo-potentials in the case of contact with friction. In this disclosure and the accompanying claims, "minimization" may be understood as extremizing the objective or finding saddle-point solutions. $c(x_c^j; x_b)$ is the contact constraint that prevents interpenetration of a cloth vertex $x_c^j$ through the body. The function c can be any potential like a signed distance field that takes on positive values whenever $x_c^j$ is outside the body and negative values whenever $x_c^j$ is inside. The zero-level set of function c defines a surface known as an implicit surface, that represents the outer surface of the body model 112. In some particular embodiments, Hermite radial basis functions (HRBFs) may be used to implement this constraint, although this is not necessary. In some particular embodiments, the implicit surface may be constructed using Moving Least Squares (MLS). In some embodiments, this constraint may be implemented using any other combination of suitable basis functions.

The exterior implicit surface may be parameterized by a set of parameters $x_s$. For an HRBF-based implicit surface, $x_s$ comprises coordinates of a point and a normal vector. In one embodiment, we may generate these parameters as a function of the body mesh surface vertices, $x_s = f(x_{b,s})$. In a simple version $f$ could be a sampling from the surface vertices of the body mesh. This effectively decouples the equation (1) system into $$\operatorname*{argmin}_{x_c, x_b} W_c(x_c) + W_b(x_b) \tag{1}$$

subject to $$c_s^k(x_{b,s}^k; X_s) = 0 \ \forall k$$

$$c_c(x_c^j; X_s) \geq 0 \ \forall j$$

where $c_s^k(\cdot; x_s)$ vanishes at the body surface vertex, $x_{b,s}^k$.

$$c_c(\cdot; x_s) = c_c(\cdot; f(x_{b,s})) = c(\cdot; x_b) \tag{2A}$$

is the original potential that enforces contact. Particular embodiments may use the same HRBF potential for $c_s$ and $c_c$, but different functions can also be used.

In addition, particular embodiments allow for vertices inside the body model 112 to slide on another surface that we call the inner body surface (or interior surface), given by $X_r$, which may determine the driving animation in a dynamic context. Particular embodiments may allow some vertices on the interior of the body mesh 112 to slide along this surface subject to a coupling energy that penalizes large displacements. This means that much of the body mesh 112 inside of the inner body surface $X_r$ is pruned, since it doesn't contribute to the deformation on the outer surface of the body model 112. This further extends the optimization to the form:

$$\operatorname*{argmin}_{x_c, x_b} W_c(x_c) + W_b(x_b) + W_r(x_{b,r}; X_r) \tag{3}$$

subject to $$c_r^l(x_{b,r}^l; X_r) = 0 \ \forall l$$

$$c_s^k(x_{b,s}^k; X_s) = 0 \ \forall k$$

$$c_c(x_c^j; X_s) \geq 0 \ \forall j$$

where $c_r^l(\cdot; X_r)$ vanishes at the inner body vertex, $x_{b,r}^l$, and $W_r$ is the sliding or coupling energy for the inner body mesh vertices with the inner body surface.

Solver

In some embodiments, the non-linear optimization problem described above may be solved directly using an interior point Newton method for non-linear optimization with non-linear equality and inequality constraints. This approach, however, scales poorly with mesh resolution. To work around this issue, particular embodiments may make use of an iterative solver that linearizes the constraints at each iteration and solves a simpler problem until convergence.

In particular, we solve the revised optimization problem:

$$\underset{x_c, x_b}{\operatorname{argmin}} \ W_c(x_c) + W_b(x_b) + W_r(x_{b,r}; X_r) \quad (4)$$

subject to $$\tilde{c}_r^l(x_{b,r}^l; X_r) = 0 \ \forall \ l$$

$$\tilde{c}_s^k(x_{b,s}^k; X_s) = 0 \ \forall \ k$$

$$\tilde{c}_c(x_c^j; X_s) \geq 0 \ \forall \ j$$

where $\tilde{c}_r^l$, $\tilde{c}_s^k$ and $\tilde{c}_c$ are first order Taylor approximations of the functions $c_r^l$, $c_s^k$ and $c_c$ respectively. Particular embodiments may involve the application of a trust region method to prevent the approximate optimization problem (4) from diverging too far from the target minimum attained by (3). More specifically we limit the step size at each iteration to a small trust region, which means that $x_c$ and $x_b$ can only vary by at most a configurable amount. The stopping condition for outer iterations is a limit on the relative residual computed as:

$$\|[(\nabla_{x_c,x_b} C)\lambda + \nabla_{x_c} W_c + \nabla_{x_b} W_b + \nabla_{x_{b,r}} W_r]_{x_c,x_b}\|_2 \quad (5)$$

where C corresponds to the combined constraint functions $c_r^l$, $c_s^k$ and $c_c$, and $\lambda$ combines all Lagrange multipliers computed for the approximate optimization problem (4) at each iteration. In some embodiments, elastodynamics and frictional contact may be separately solved for; in some such an embodiment elastodynamics may be solved using any one of problems (1) through (4) without constraints $c_c$ and $c_s$, and subsequently the frictional contact problem may be solved using a method such as Staggered Projections.

Material Model

The cloth and body energies may be based on any form of constitutive model of the material. In one particular embodiment, a material model based on the classic compressible Neo-Hookean model is augmented with higher order terms from the generalized Rivlin model.

Below, we use F to represent the deformation gradient determined on a per element (cell) basis, and $C := F^T F$. Particular implementations may use linear tetrahedral elements, but higher order elements with more complex geometries can be used here.

The compressible Neo-Hookean model is defined by the following energy density:

$$\psi_{NH} = \frac{\mu}{2} tr(C - I) - \mu \log \det F + \frac{\lambda}{2} \log^2 \det F \quad (6)$$

where I is the identity matrix and $\mu$ and $\lambda$ are the Lamé coefficients described below. This energy density leads to a first Piola-Kirchoff stress tensor:

$$P_{NH}(F) = \nabla_F \psi_{NH}(F) = \mu(F - F^{-T}) + \lambda(\log \det F) F^{-T} \quad (7)$$

Some embodiments involve extending the Neo-Hookean model with additional polynomial terms from the generalizes Rivlin model to get a new energy density:

$$\psi_{PB} = \sum_{p=1}^{4} \frac{\mu_p}{2p} tr((C - I)^p) - \mu_1 \log \det F + \frac{\lambda}{2} \log^2 \det F \quad (8)$$

which has first Piola-Kirchoff stress tensor:

$$P_{PB}(F) = \quad (9)$$

$$\nabla_F \psi_{PB}(F) = \mu_1 (F - F^{-T}) + \sum_{p=2}^{4} \mu_p F(C - I)^{p-1} + \lambda(\log \det F) F^{-T}$$

Lamé Coefficients

The Lamé coefficients ($\mu_p$ and $\lambda$) may be derived from a Young's Modulus ($Y_p$) and Poisson Ratio (v) by:

$$\mu_p = \frac{1}{2} \frac{Y_p}{1+v} \quad p = 1, 2, 3, 4 \quad (10)$$

$$\lambda = \frac{v}{1-2v} \frac{Y_1}{1+v}$$

for $Y_p \geq 0$ and $0 \leq v < 0.5$.

Friction

The optimization problem described above handles contact but not friction. This section covers extensions which may be used in particular embodiments to enable frictional contact dynamics.

Let $x_c^j$ denote the jth contact point on the cloth. In one embodiment, this will coincide with a cloth vertex. The optimizations involved to solve for contact and friction may be staggered in some embodiments. After solving the optimization problem in equation (4), we get a Lagrange multiplier, $\lambda_j$, for the last constraint, $\tilde{c}_c(x_c^j; X_s) \geq 0$ for each cloth vertex $x_c^j$. The resulting displacement along with this multiplier may be used to compute a frictional impulse by solving a subsequent optimization problem. With a suitable mapping ($\Gamma_j$) from the surface sites $X_s$, or surface body vertices $x_{b,s}$ to each contact point $x_c^j$, solving the following minimization problem for each contact j, gives a frictional impulse:

$$\underset{\beta}{\arg \min} \ \beta^T T_j^T \Gamma_j \Delta x \quad (11)$$

subject to $$\|\beta^T T_j^T\| \leq \mu_j \lambda_j$$

where $T_j$ corresponds to the tangent space at contact point j and $\beta$ is the frictional impulse. The displacement is denoted by $\Delta x$ and corresponds to displacement in cloth as well as body. We may repeat this minimization along with (4) until convergence to obtain a complete frictional contact impulse.

Sliding Thick Skin (STS) Model

Previous work in biomechanics has focused on modeling constitutive properties of soft tissue samples removed from the body. However, such data are not useful on their own for simulating entire humans. Tissue behavior due to external contact is profoundly affected by the boundary conditions imposed by the deep layers of the body, which are largely unknown. Moreover, since soft tissues are highly non-linear in compression, the thickness of the tissue layer has great influence on the observed surface tractions due to contact. Therefore, materials properties may be generalized in some embodiments to also include the effective thickness of the soft tissue layer at the same time. Note that effective thickness may not correspond to an actual thickness of a part of body. Rather, it is a thickness that, when used with a corresponding constitutive property, best approximates the deformation behavior at the surface of the body. In addition, human soft tissues are relatively thin in many regions, with significant sliding behavior in tangential directions. The underlying biomechanical reason for this is that the connective tissue binding the dermis to subcutaneous muscles and bone has to be somewhat loose in many areas to avoid impeding movement.

Some embodiments may involve modeling the specific features of this observed orthotropy by representing the soft tissue covering the body as a volumetric thick skin layer that can slide over the inner body surface. This "Sliding Thick Skin" (STS) model contrasts with the "thin skin" model proposed previously which does not model deformation of the body in the direction normal to the skin surface. The volumetric part $m_V$, in some embodiments, be modeled as a non-linear hyperelastic material. In one embodiment, this may be a generalized Rivlin-type polynomial model. The inner surface of the thick skin may be elastically coupled to the inner body surface upon which it slides, approximating both the effect of connective tissue fascia and neighbouring soft tissues. Even though our parameters are inspired by biomechanical structures, we emphasize that it is a phenomenological model. For instance, the "thickness" ought not to be interpreted as the actual thickness of skin (however that is defined), but an effective value that can be used for simulation.

Constitutive Model

The mathematical model describing STS material can be written as follows. The inner body is represented as a smooth implicit surface. In one embodiment the implicit surface is constructed using Hermite radial basis functions (HRBF) to represent the inner body, with centers offset from the outer surface of the body by the estimated thickness. The HRBFs define a scalar field $c_r(x)$ whose zero level set defines the inner body surface. In some embodiment, Moving Least Squares (MLS) may be used to define the scalar field $c_r(x)$. We may constrain the inner vertices $x_{b,r}$ to slide along the implicit surface. For a quasi-static simulation we solve the following constrained optimization problem:

$$\underset{x_b}{\operatorname{argmin}} \; W_b(x_b) + W_r(x_{b,r}; X_r) \quad (12)$$

subject to $$c_r^l(x_{b,r}^l; x_r) = 0 \; \forall \, l$$

Here $W_b$ and $W_r$ are the energies for elasticity and coupling potential. The sliding constraint allows us to have an inner body surface that is not conforming to the zero level set. This approach has the benefit that we can discretize the full human body once and cull sets that are entirely in the inner body, and constrain the vertices on the remaining boundary to sliding on level sets of the inner body. This avoids constant remeshing as estimated thickness varies across participants.

The energy $W_b$ may be the elastic potential energy, the Gibbs' function that encodes Gauss's principle of least constraint, the Hamiltonian, or the Lagrangian. The potential energy may include pseudo-potentials in the case of contact with friction.

In one embodiment, we use a compressible neo-Hookean energy with a few extra terms taken from the generalized Rivlin model (also known as polynomial hyperelastic model). More specifically, $$W_b = \frac{\mu}{2}(tr(C-I) - 2 \, \log(det(F))) + \frac{\mu_4}{8} tr((C-I)^4) + \frac{\lambda}{2} \log^2(det(F)) \quad (13)$$

The quartic term helps capture the biphasic nature of the observed force-displacement relationship.

The coupling potential $W_r$ controls sliding resistance of the tissue. It may be modeled as zero length spring, but $W_r$ can be general elastic like potential.

FIG. 5 illustrates a comparison between a first three dimensional representation of a garment (e.g. a sports bra as illustrated) generated using a rigid three dimensional human body model (as has been done in prior art techniques) and a second three dimensional representation of the garment generated using a soft three dimensional human body model. The soft three dimensional human body model and its interaction with the garment model are simulated using one or more of the methods described elsewhere herein. As described elsewhere herein, the soft three dimensional human body model may be deformed when it interacts with the garment. The rigid three dimensional human body model may not be deformed.

Each of FIGS. 5A to 5G illustrates a different time step in a simulation involving movement of the body for the rigid and soft three dimensional human body models. FIGS. 5A to 5G may, for example, correspond to different poses generated when rigid and soft three dimensional human body models simulate running.

Figure 6:
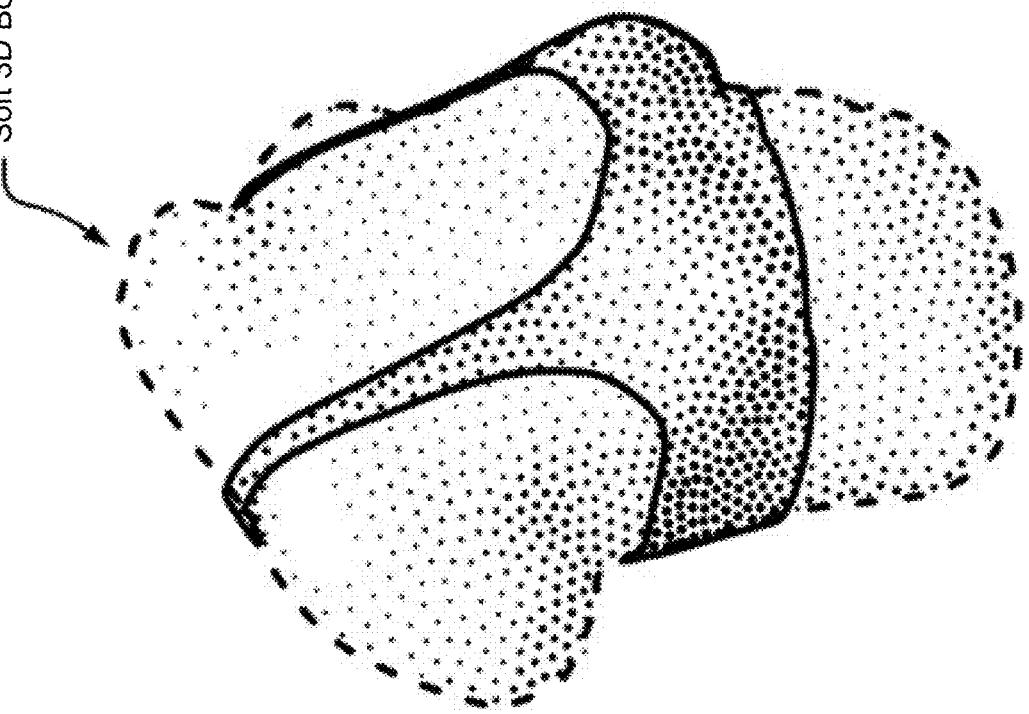
FIG. 6 illustrates the same garment as shown in FIG. 5 modelled on a rigid body model where the body moves over a series of time steps.
Figure 6:
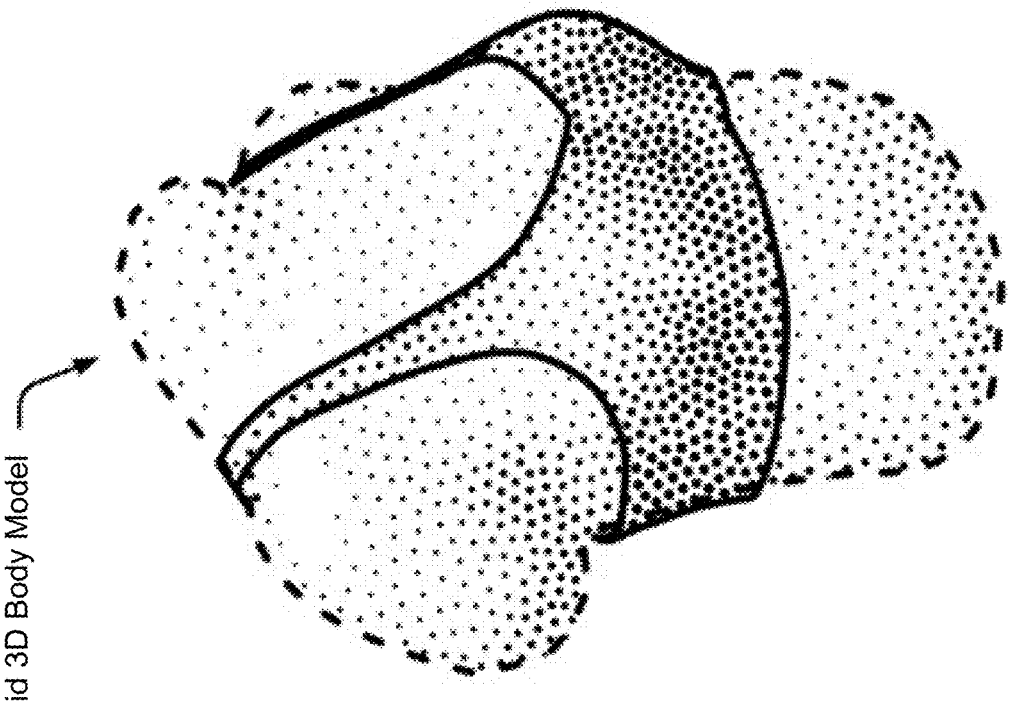

As shown in FIG. 5, the second three dimensional representation of the garment conforms to different tissue orientations and/or deformations of the soft three dimensional human body model. For example, in FIG. 5G, the second three dimensional representation of the garment conforms to downward deformation of modeled breast tissue of the soft three dimensional human body model. Such downward deformation becomes visible when compared to the rigid three dimensional representation of the human body model. An expanded (i.e. zoomed-in) version of FIG. 5G is shown in FIG. 6.

Figure 7:
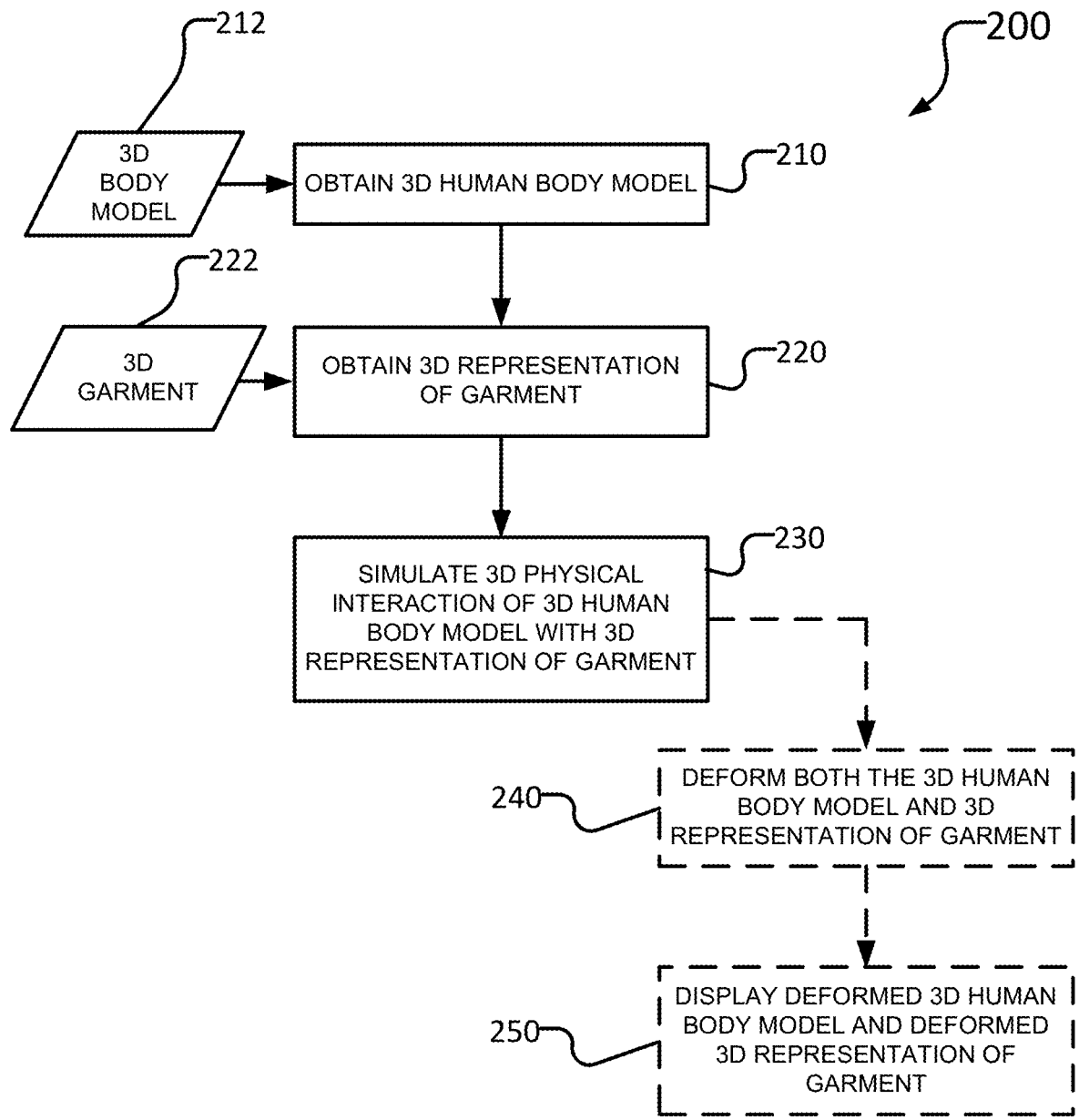
FIG. 7 is a flow chart of an example method for simulating three dimensional physical interaction of the three-dimensional human body model with the three-dimensional representation of the garment according to a particular embodiment of the invention.

FIG. 7 illustrates a method 200 for simulating physical interaction of a 3D representation of a garment with a 3D human body model.

Method 200 of the illustrated embodiment commences in block 210. Block 210 comprises obtaining a 3D human body model 212. 3D human body model 212 is identical to 3D human body model 112 described elsewhere herein. Method 200 then proceeds to block 220 which comprises obtaining a 3D representation 222 of a garment. 3D representation 222 of the garment may be generated from a plurality of garment pattern elements (e.g. garment pattern elements 122 described elsewhere herein), although this is not necessary and a 3D representation of the garment may originate from another source. In some embodiments, 3D representation 222 of the garment is identical to 3D garment model 152 described elsewhere herein.

Method 200 then proceeds to block 230 which comprises simulating 3D physical interaction of 3D human body model 212 with 3D representation 222 of the garment. As discussed elsewhere herein, simulating the three dimensional physical interaction may comprise: deforming both the 3D human body model 212 and the 3D representation 222 of the garment (i.e. block 240); and displaying the deformed 3D human body model 212 and the deformed 3D representation 222 of the garment (i.e. block 250). The block 240 simulation may be performed over a series of discrete time steps and may involve solving optimization problems to ascertain the model parameters at each such time step.

In some embodiments, block 250 comprises using a commercially available display to display the deformed 3D human body model 212 and the deformed 3D representation 222 of the garment. In some embodiments, block 250 comprises manipulating a graphical user interface of an application (e.g. a web app) to display the deformed 3D human body model 212 and the deformed 3D representation 222 of the garment.

Interpretation of Terms

Unless the context clearly requires otherwise, throughout the description and the claims:

"comprise", "comprising", and the like are to be construed in an inclusive sense, as opposed to an exclusive or exhaustive sense; that is to say, in the sense of "including, but not limited to";

"connected", "coupled", or any variant thereof, means any connection or coupling, either direct or indirect, between two or more elements; the coupling or connection between the elements can be physical, logical, or a combination thereof; elements which are integrally formed may be considered to be connected or coupled;

"herein", "above", "below", and words of similar import, when used to describe this specification, shall refer to this specification as a whole, and not to any particular portions of this specification;

"or", in reference to a list of two or more items, covers all of the following interpretations of the word: any of the items in the list, all of the items in the list, and any combination of the items in the list;

the singular forms "a", "an", and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

Embodiments of the invention may be implemented using specifically designed hardware, configurable hardware, programmable data processors configured by the provision of software (which may optionally comprise "firmware") capable of executing on the data processors, special purpose computers or data processors that are specifically programmed, configured, or constructed to perform one or more steps in a method as explained in detail herein and/or combinations of two or more of these. Examples of specifically designed hardware are: logic circuits, application-specific integrated circuits ("ASICs"), large scale integrated circuits ("LSIs"), very large scale integrated circuits ("VLSIs"), and the like. Examples of configurable hardware are: one or more programmable logic devices such as programmable array logic ("PALs"), programmable logic arrays ("PLAs"), and field programmable gate arrays ("FPGAs")). Examples of programmable data processors are: microprocessors, digital signal processors ("DSPs"), embedded processors, graphics processors, math co-processors, general purpose computers, server computers, cloud computers, mainframe computers, computer workstations, and the like. For example, one or more data processors in a computer system for a device may implement methods as described herein by executing software instructions in a program memory accessible to the processors.

Processing may be centralized or distributed. Where processing is distributed, information including software and/or data may be kept centrally or distributed. Such information may be exchanged between different functional units by way of a communications network, such as a Local Area Network (LAN), Wide Area Network (WAN), or the Internet, wired or wireless data links, electromagnetic signals, or other data communication channel.

For example, while processes or blocks are presented in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

In addition, while elements are at times shown as being performed sequentially, they may instead be performed simultaneously or in different sequences. It is therefore intended that the following claims are interpreted to include all such variations as are within their intended scope.

Software and other modules may reside on servers, workstations, personal computers, tablet computers, image data encoders, image data decoders, PDAs, color-grading tools, video projectors, audio-visual receivers, displays (such as televisions), digital cinema projectors, media players, and other devices suitable for the purposes described herein. Those skilled in the relevant art will appreciate that aspects of the system can be practised with other communications, data processing, or computer system configurations, including: Internet appliances, hand-held devices (including personal digital assistants (PDAs)), wearable computers, all manner of cellular or mobile phones, multi-processor systems, microprocessor-based or programmable consumer electronics (e.g., video projectors, audio-visual receivers, displays, such as televisions, and the like), set-top boxes, color-grading tools, network PCs, mini-computers, mainframe computers, and the like.

Embodiments of the invention may also be provided in the form of a program product. The program product may comprise any non-transitory medium which carries a set of computer-readable instructions which, when executed by a data processor, cause the data processor to execute a method of the invention. Program products according to the invention may be in any of a wide variety of forms. The program product may comprise, for example, non-transitory media such as magnetic data storage media including floppy diskettes, hard disk drives, optical data storage media including CD ROMs, DVDs, electronic data storage media including ROMs, flash RAM, EPROMs, hardwired or preprogrammed chips (e.g., EEPROM semiconductor chips), nanotechnology memory, or the like. The computer-readable signals on the program product may optionally be compressed or encrypted.

In some embodiments, the invention may be implemented in software. For greater clarity, "software" includes any instructions executed on a processor, and may include (but is not limited to) firmware, resident software, microcode, and the like. Both processing hardware and software may be centralized or distributed (or a combination thereof), in whole or in part, as known to those skilled in the art. For example, software and other modules may be accessible via local memory, via a network, via a browser or other application in a distributed computing context, or via other means suitable for the purposes described above.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Where a record, field, entry, and/or other element of a database is referred to above, unless otherwise indicated, such reference should be interpreted as including a plurality of records, fields, entries, and/or other elements, as appropriate. Such reference should also be interpreted as including a portion of one or more records, fields, entries, and/or other elements, as appropriate. For example, a plurality of "physical" records in a database (i.e. records encoded in the database's structure) may be regarded as one "logical" record for the purpose of the description above and the claims below, even if the plurality of physical records includes information which is excluded from the logical record.

Specific examples of systems, methods and apparatus have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

Various features are described herein as being present in "some embodiments". Such features are not mandatory and may not be present in all embodiments. Embodiments of the invention may include zero, any one or any combination of two or more of such features. This is limited only to the extent that certain ones of such features are incompatible with other ones of such features in the sense that it would be impossible for a person of ordinary skill in the art to construct a practical embodiment that combines such incompatible features. Consequently, the description that "some embodiments" possess feature A and "some embodiments" possess feature B should be interpreted as an express indication that the inventors also contemplate embodiments which combine features A and B (unless the description states otherwise or features A and B are fundamentally incompatible).

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

What is claimed is:

1. A method for generating a three dimensional representation of a garment, the method comprising:
   obtaining a three dimensional human body model comprising an outer surface, the outer surface representative of an outermost surface of a human body;
   obtaining a three dimensional representation of a garment; and
   simulating a three dimensional physical interaction of the three dimensional body model with a three dimensional representation of the garment;
   wherein simulating the three-dimensional physical interaction comprises:
      simulating physical interaction of the three dimensional human body model with the three dimensional representation of the garment to thereby deform the three dimensional human body model; and
      simulating physical interaction of the three dimensional representation of the garment with the three dimensional human body model to thereby deform the three dimensional representation of the garment; and
   displaying the deformed three-dimensional human body model and the deformed three-dimensional representation of the garment;
   wherein simulating the three-dimensional physical interaction comprises optimizing an energy function that represents a variational formulation of the physical properties of deformation of the body and the garment, which attributes cost to deformation of the body and garment away from a reference state;
   wherein optimizing the energy function is subject to one or more non-penetration constraints that prevent the three dimensional representation of the garment from penetrating the three-dimensional human body model;
   wherein the one or more non-penetration constraints that prevent the three dimensional representation of the garment from penetrating the three-dimensional human body model comprise:
      an intermediate implicit surface which is constrained by the outer surface of the three-dimensional human body model; and
      one or more intermediate constraints that prevent the three dimensional representation of the garment from penetrating the implicit surface; and
   wherein optimizing the energy function subject to one or more non-penetration constraints comprises solving or approximating a solution of a system having a formulation $$\operatorname*{argmin}_{x_c, x_b} W_c(x_c) + W_b(x_b) \tag{1}$$

subject to $$c_s^k(x_{b,s}^k; X_s) = 0 \ \forall k$$

$$c_c(x_c^j; X_s) \geq 0 \ \forall j$$

where:
   $x_c$ are vertices of the three dimensional representation of the garment;
   $x_c^j$ is a $j^{th}$ vertex of the three dimensional representation of the garment;
   $x_b$ are the vertices of the three dimensional human body model;
   $x_{b,s}$ are the surface vertices of the three dimensional human body model;

$x_{b,s}^k$ is a $k^{th}$ surface vertex of the three dimensional human body model;

$X_s$ is a set of parameters that define the intermediate implicit surface;

$x_s$ is a parameter of the intermediate implicit surface defined by $X_s$, where $x_s$ is itself parameterized as a function $x_s = f(x_{b,s})$ of the surface vertices $x_{b,s}$;

$W_c$ is an objective function of the garment;

$W_b$ is an objective function of the body;

$c_s^k(\cdot; x_s)$ is a constraint on the $k^{th}$ surface vertex of the three dimensional human body model that vanishes at $x_{b,s}^k$; and $c_c(\cdot; x_s) = c_c(\cdot; f(x_{b,s})) = c(\cdot; x_b)$ is a contact constraint that prevents interpenetration of $x_c^j$ through the body.

2. A method according to claim 1 wherein the energy function comprises a pseudo-potential representing frictional energy dissipation due to deformation.

3. A method according to claim 1 wherein the three dimensional human body model comprises a three-dimensional body mesh and the three dimensional representation of the garment comprises at least one of: a two-dimensional garment mesh in a three-dimensional space; and a three-dimensional garment mesh.

4. A method for generating a three dimensional representation of a garment, the method comprising:
obtaining a three dimensional human body model comprising an outer surface, the outer surface representative of an outermost surface of a human body;
obtaining a three dimensional representation of a garment; and
simulating a three dimensional physical interaction of the three dimensional body model with a three dimensional representation of the garment;
wherein simulating the three-dimensional physical interaction comprises:
simulating physical interaction of the three dimensional human body model with the three dimensional representation of the garment to thereby deform the three dimensional human body model; and
simulating physical interaction of the three dimensional representation of the garment with the three dimensional human body model to thereby deform the three dimensional representation of the garment; and
displaying the deformed three-dimensional human body model and the deformed three-dimensional representation of the garment;
wherein the three dimensional human body model comprises a three-dimensional body mesh and the three dimensional representation of the garment comprises at least one of: a two-dimensional garment mesh in a three-dimensional space; and a three-dimensional garment mesh;
wherein the method comprises constraining the three-dimensional body mesh to avoid penetration of an inner body surface, the inner body surface comprising an implicit surface;
wherein constraining the three-dimensional body mesh to avoid penetration of the inner body surface comprises allowing vertices on an interior of the three-dimensional body mesh to slide relative to the inner body surface subject to a coupling energy that penalizes displacements.

5. A method according to claim 4 wherein simulating the three-dimensional physical interaction comprises:
optimizing an energy function that represents a variational formulation of the physical properties of deformation of the body and the garment, which attributes cost to deformation of the body and garment away from a reference state.

6. A method according to claim 5 wherein optimizing the energy function is subject to one or more non-penetration constraints that prevent the three dimensional representation of the garment from penetrating the three-dimensional human body model.

7. A method according to claim 6 wherein the one or more non-penetration constraints that prevent the three dimensional representation of the garment from penetrating the three-dimensional human body model comprise:
an intermediate implicit surface which is constrained by the outer surface of the three-dimensional human body model; and
one or more intermediate constraints that prevent the three dimensional representation of the garment from penetrating the intermediate implicit surface.

8. A method for generating a three dimensional representation of a garment, the method comprising:
obtaining a three dimensional human body model comprising an outer surface, the outer surface representative of an outermost surface of a human body;
obtaining a three dimensional representation of a garment; and
simulating a three dimensional physical interaction of the three dimensional body model with a three dimensional representation of the garment;
wherein simulating the three-dimensional physical interaction comprises:
simulating physical interaction of the three dimensional human body model with the three dimensional representation of the garment to thereby deform the three dimensional human body model; and
simulating physical interaction of the three dimensional representation of the garment with the three dimensional human body model to thereby deform the three dimensional representation of the garment; and
displaying the deformed three-dimensional human body model and the deformed three-dimensional representation of the garment;
wherein simulating the three-dimensional physical interaction comprises optimizing an energy function that represents a variational formulation of the physical properties of deformation of the body and the garment, which attributes cost to deformation of the body and garment away from a reference state;
wherein the energy function comprises a pseudo-potential representing frictional energy dissipation due to deformation;
wherein the method comprises:
solving or approximating the optimization problems defined by $$\operatorname*{argmin}_{x_c, x_b} W_c(x_c) + W_b(x_b)$$

subject to $$c(x_c^j; x_b) \geq 0 \ \forall j$$

where:
$x_c$ are vertices of the three dimensional representation of the garment;
$x_c^j$ is a $j^{th}$ vertex of the three dimensional representation of the garment;

$x_b$ are the vertices of the three dimensional human body model;

$W_c$ is an objective function of the garment;

$W_b$ is an objective function of the body; and $c(x_c^j; x_b)$ is a constant constraint that prevents interpenetration of $x_c^j$ through the body; and solving or approximating, for each j, the optimization problem defined by $$\arg\min_{\beta} \beta^T T_j^T \Gamma_j \Delta x$$

subject to $$\|\beta^T T_i^T\| \le \mu_j \lambda_j$$

where:

$\Delta x$ is a displacement in the garment and the body;

$\lambda j$ is a Lagrange multiplier for the $j^{th}$ vertex of the three dimensional representation of the garment;

$\Gamma_j$ is a mapping from surface vertices $x_{b,s}$ of the three dimensional human body model to each $x_c^j$;

$T_j$ is a transpose of a set of vectors in a tangent space at $x_c^j$; and

B is a frictional impulse.

9. A method according to claim 8 wherein the three dimensional human body model comprises a three-dimensional body mesh and the three dimensional representation of the garment comprises at least one of: a two-dimensional garment mesh in a three-dimensional space; and a three-dimensional garment mesh.

10. A method according to claim 9 comprising constraining the three-dimensional body mesh to avoid penetration of an inner body surface.

11. A method according to claim 10 wherein the inner body surface is represented as an implicit surface.

12. A method according to claim 10 wherein the contact constraint $c(x_c^j; x_b)$ comprises a constraint which allows vertices on an interior of the three-dimensional body mesh to slide relative to the inner body surface subject to a coupling energy that penalizes displacements.

13. A method according to claim 8 wherein simulating the three dimensional physical interaction of the three dimensional body model with the three dimensional representation of the garment comprises:

obtaining a movement of the body model which models movement of the three-dimensional human body model over a series of time steps;

for each of the time steps, optimizing the energy function.

14. A method according to claim 8 wherein the contact constraint $c(x_c^j; x_b)$ comprises one or more non-penetration constraints that prevent the three dimensional representation of the garment from penetrating the three-dimensional human body model, the one or more non-penetration constraints comprising:

an intermediate implicit surface which is constrained by the outer surface of the three-dimensional human body model; and one or more intermediate constraints that prevent the three dimensional representation of the garment from penetrating the intermediate implicit surface.

15. A method according to 14 wherein the one or more intermediate constraints are constructed by a combination of basis functions.

16. A method for generating a three dimensional representation of a garment, the method comprising:

obtaining a three dimensional human body model comprising an outer surface, the outer surface representative of an outermost surface of a human body;

obtaining a three dimensional representation of a garment; and simulating a three dimensional physical interaction of the three dimensional body model with a three dimensional representation of the garment;

wherein simulating the three-dimensional physical interaction comprises:

deforming both the three-dimensional human body model and the three dimensional representation of the garment; and displaying the deformed three-dimensional human body model and the deformed three-dimensional representation of the garment;

wherein deforming both the three-dimensional human body model and the three-dimensional representation of the garment comprises optimizing an energy function that represents a variational formulation of the physical properties of deformation of the body and the garment, which attributes cost to deformation of the body and garment away from a reference state;

wherein the three dimensional human body model comprises a three-dimensional body mesh and the method comprises constraining the three-dimensional body mesh to avoid penetration of an inner body surface, the inner body surface comprising an implicit surface;

wherein constraining the three-dimensional body mesh to avoid penetration of the inner body surface comprises allowing vertices on an interior of the three-dimensional body mesh to slide relative to the inner body surface subject to a coupling energy that penalizes displacements.

17. A method according to claim 16 wherein the energy function comprises a pseudo-potential representing frictional energy dissipation due to deformation.

18. A method according to claim 16 wherein optimizing the energy function is subject to one or more non-penetration constraints that prevent the three dimensional representation of the garment from penetrating the three-dimensional human body model.

19. A method according to claim 18 wherein the one or more non-penetration constraints that prevent the three dimensional representation of the garment from penetrating the three-dimensional human body model comprise:

an intermediate implicit surface which is constrained by the outer surface of the three-dimensional human body model; and one or more intermediate constraints that prevent the three dimensional representation of the garment from penetrating the intermediate implicit surface.

20. A method according to claim 16 wherein simulating the three dimensional physical interaction of the three dimensional body model with the three dimensional representation of the garment comprises:

obtaining a movement of the body model which models movement of the three-dimensional human body model over a series of time steps;

for each of the time steps, optimizing an energy function that represents a variational formulation of the physical properties of deformation of the body and the garment, which attributes cost to deformation of the body and garment away from a reference state.

* * * * *